(12) United States Patent
Hoelter et al.

(10) Patent No.: US 9,897,645 B2
(45) Date of Patent: Feb. 20, 2018

(54) ILLUMINATOR FOR WAFER PROBER AND RELATED METHODS

(71) Applicant: FLIR Systems, Inc., Wilsonville, CA (US)

(72) Inventors: Theodore R. Hoelter, Goleta, CA (US); Austin A. Richards, Santa Barbara, CA (US); Eric A. Kurth, Santa Barbara, CA (US)

(73) Assignee: FLIR Systems, Inc., Wilsonville, OR (US)

( * ) Notice: Subject to any disclaimer, the term of this patent is extended or adjusted under 35 U.S.C. 154(b) by 149 days.

(21) Appl. No.: 14/642,333

(22) Filed: Mar. 9, 2015

(65) Prior Publication Data

US 2015/0177313 A1 Jun. 25, 2015

Related U.S. Application Data

(63) Continuation of application No. PCT/US2013/059540, filed on Sep. 12, 2013.

(Continued)

(51) Int. Cl.
*B01J 19/12* (2006.01)
*G01R 31/265* (2006.01)

(Continued)

(52) U.S. Cl.
CPC .......... *G01R 31/2656* (2013.01); *B01J 19/12* (2013.01); *G01J 5/0809* (2013.01); *G01J 5/0818* (2013.01);

(Continued)

(58) Field of Classification Search
CPC .............. G01R 31/2656; G01R 31/302; G02B 26/0816; G02B 26/04; G02B 5/08;

(Continued)

(56) References Cited

U.S. PATENT DOCUMENTS 4,885,463 A * 12/1989 Wellman ................. G01J 5/522
250/252.1
5,343,040 A 8/1994 Wiese et al.
(Continued)

FOREIGN PATENT DOCUMENTS

JP 2005106642 4/2005

*Primary Examiner* — Julian Huffman
*Assistant Examiner* — Michael Konczal
(74) *Attorney, Agent, or Firm* — Haynes and Boone, LLP (57) ABSTRACT

Various techniques are disclosed for an illuminator and related methods to be used with a wafer prober to provide illumination (e.g., visible and/or non-visible electromagnetic radiation) to perform testing, calibration, and/or inspection of devices on a wafer. For example, an illuminator may include a plurality of radiation sources, a reflector, an actuator for the reflector, a shutter, an actuator for the shutter, and/or a light pipe. Various components of the illuminator may interface with a wafer prober to provide sufficiently uniform and stable illumination with fast-switching intensities, wavelengths, and/or other properties. Such illumination provided by various embodiments of the illuminator may permit the wafer prober to perform high-throughput testing, calibration, and/or inspection of devices that may be fabricated and/or packaged on a wafer.

20 Claims, 10 Drawing Sheets

Related U.S. Application Data (60) Provisional application No. 61/701,151, filed on Sep. 14, 2012.

(51) Int. Cl.

| | |
|---|---|
| *G01J 5/08* | (2006.01) |
| *G01J 5/52* | (2006.01) |
| *G02B 27/09* | (2006.01) |
| *G01J 5/20* | (2006.01) |
| *G02B 5/08* | (2006.01) |
| *F21V 8/00* | (2006.01) |
| *G02B 26/04* | (2006.01) |
| *G02B 26/08* | (2006.01) |
| *G01R 31/302* | (2006.01) |

(52) U.S. Cl.
CPC ............... *G01J 5/0896* (2013.01); *G01J 5/20* (2013.01); *G01J 5/522* (2013.01); *G02B 5/08* (2013.01); *G02B 6/0096* (2013.01); *G02B 26/04* (2013.01); *G02B 26/0816* (2013.01); *G02B 27/0927* (2013.01); *G02B 27/0977* (2013.01); *G01R 31/302* (2013.01)

(58) Field of Classification Search
CPC .............. G02B 6/0096; G02B 27/0977; G02B 27/0927; G02B 26/0825; G02B 26/0833; G02B 26/12; G02B 26/105; G01J 5/20; G01J 5/522; G01J 5/0818; G01J 5/089; G01J 5/0896; B01J 19/12
See application file for complete search history.

(56) References Cited

U.S. PATENT DOCUMENTS

| | | | |
|---|---|---|---|
| 5,590,955 A * | 1/1997 | Bornhorst | F21S 10/06 362/232 |
| 7,408,365 B2 * | 8/2008 | Lee | G01N 21/9501 324/754.23 |
| 2007/0242924 A1* | 10/2007 | Cianciotto | G02B 6/0008 385/133 |

* cited by examiner

ILLUMINATOR FOR WAFER PROBER AND RELATED METHODS

CROSS-REFERENCE TO RELATED APPLICATIONS

This application is a continuation of U.S. International Patent Application No. PCT/US2013/059540 filed Sep. 12, 2013 and entitled "ILLUMINATOR FOR WAFER PROBER AND RELATED METHODS".

U.S. International Patent Application No. PCT/US2013/059540 claims the benefit of U.S. Provisional Patent Application No. 61/701,151 filed Sep. 14, 2012 and entitled "ILLUMINATOR FOR WAFER PROBER AND RELATED METHODS" both of which are hereby incorporated by reference in their entirety.

TECHNICAL FIELD

One or more embodiments of the invention relate generally to wafer probers and more particularly, for example, to illuminators for wafer probers.

BACKGROUND

Imaging sensor devices such as charge coupled devices (CCDs) and complementary metal oxide semiconductor (CMOS) sensors are fabricated on wafers and also typically packaged (e.g., integrated with readout circuits and/or other components) at the wafer level. Accordingly, wafer-level testing of imaging sensor devices has become an important part of overall quality control processes.

In general, wafer-level testing may be performed using wafer probers. For imaging sensor devices, wafer-level testing may include illuminating the imaging sensor devices with radiation of varying intensities and/or wavelengths. However, conventional wafer probers are typically unable to rapidly switch between different illumination sources in a manner that permits reliable, high-speed, high-throughput testing of imaging sensor devices. In some cases, complex and expensive relay optics are used to improve illumination for wafer-level testing. However, such implementations are often too costly and space-prohibitive.

SUMMARY

In various embodiments, an illuminator and related methods may be used with a wafer prober to provide illumination (e.g., visible and/or non-visible electromagnetic radiation) to perform testing, calibration, and/or inspection of devices on a wafer. For example, an illuminator may include a plurality of radiation sources, a reflector, an actuator for the reflector, a shutter, an actuator for the shutter, and/or a light pipe. Various components of the illuminator may interface with a wafer prober to provide sufficiently uniform and stable illumination with fast-switching intensities, wavelengths, and/or other properties. Such illumination provided by various embodiments of the illuminator may permit the wafer prober to perform high-throughput testing, calibration, and/or inspection of devices that may be fabricated and/or packaged on a wafer.

In one embodiment, an apparatus may include a plurality of infrared (IR) radiation sources; a reflector adapted to receive IR radiation from the IR radiation sources; an actuator adapted to selectively move the reflector to a plurality of different positions to direct the IR radiation emitted from different selected ones of the IR radiation sources to devices on a wafer; and wherein the apparatus is adapted to be implemented with a wafer prober to test the devices.

In another embodiment, a method may include emitting infrared (IR) radiation from a plurality of IR radiation sources; receiving the IR radiation from at least one of the IR radiation sources at a reflector; selectively moving the reflector to a plurality of different positions; and while the reflector is at each position, directing by the reflector the IR radiation emitted from a different selected one of the IR radiation sources to devices on a wafer.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the invention and their advantages are best understood by referring to the detailed description that follows. It should be appreciated that like reference numerals are used to identify like elements illustrated in one or more of the figures.

DETAILED DESCRIPTION

According to one or more embodiments of the disclosure, an illuminator is provided that may be adapted to interface with, installed on, or otherwise be implemented with a wafer prober. The wafer prober may be configured to test various operations of many individual wafer-level packaged imaging devices (e.g., infrared imaging devices comprising focal plane arrays (FPAs), CMOS sensor devices, CCDs, or other imaging devices) fabricated on a wafer. Using a plurality of radiation sources and an actuated reflector, the illuminator may rapidly and selectively provide different levels of illumination (e.g., electromagnetic radiation) with different intensities, so that responsivity and/or other operational parameters of the imaging devices on the wafer can be tested with high throughput.

In various embodiments, the illuminator may allow efficient transmission (e.g., low loss) of radiation from radiation sources to one or more devices on the wafer, such that power requirements for the radiation sources may be reduced. In various embodiments, the illuminator may also provide substantially uniform illumination over the one or more devices on the wafer, such that all pixels (e.g., microbolometers, photo detectors, or other sensor elements) of the one or more imaging sensor devices on a common wafer or multiple wafers may be illuminated at the same time (e.g., simultaneously) for testing in an accurate and repeatable manner.

Figure 1:
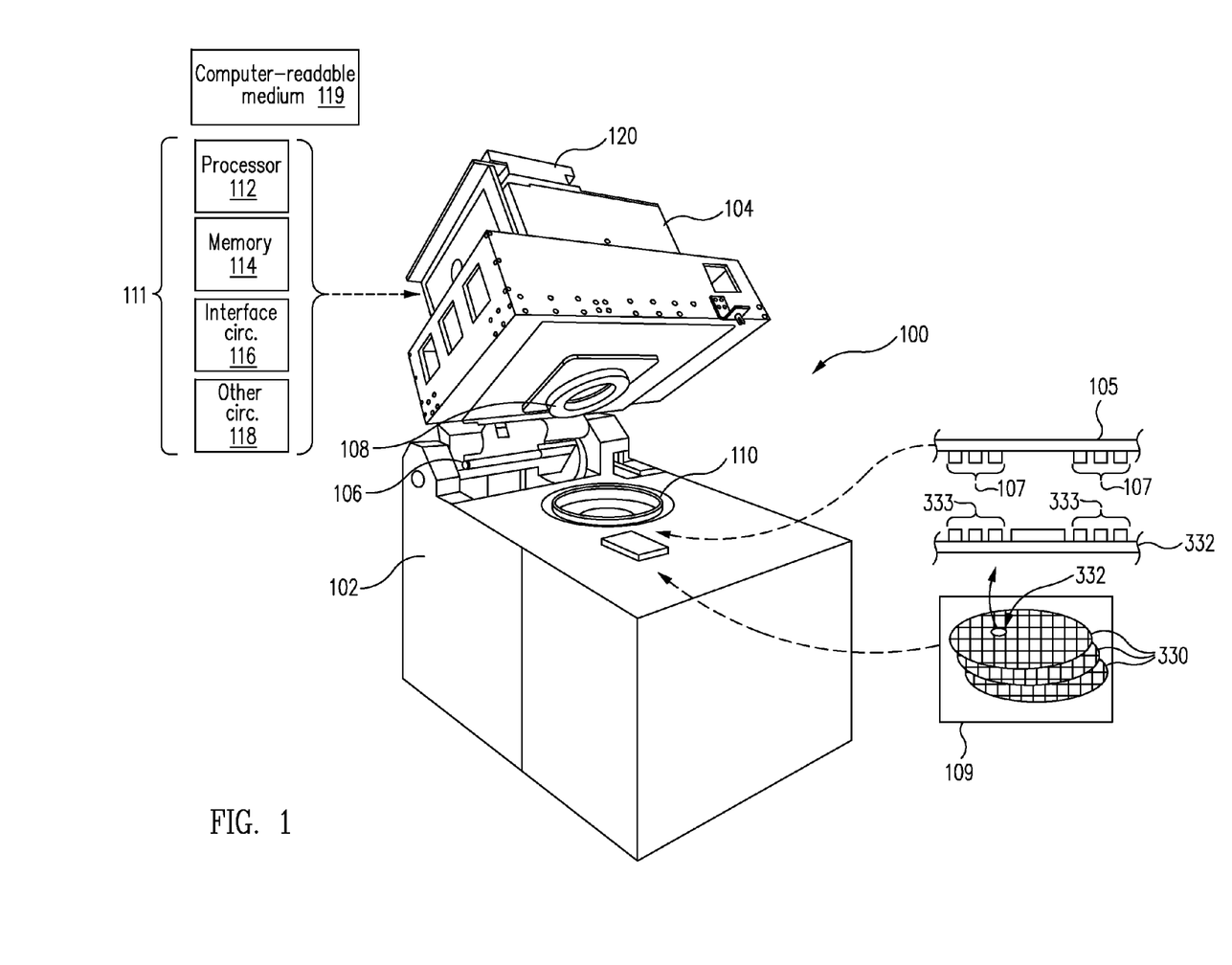
FIG. 1 illustrates a perspective view of a wafer prober in accordance with an embodiment of the disclosure.

FIG. 1 illustrates a perspective view of a wafer prober 100, in accordance with an embodiment of the disclosure. In various embodiments, wafer prober 100 may include a main body 102 and a test head 104. Main body 102 may include various mechanisms to transport, position, align, and/or otherwise place one or more wafers 330 in appropriate positions for testing. In some embodiments, main body 102 may include an internal chamber to contain one or more cassettes 109 storing wafers 330 before and/or after testing. In some embodiments, each one of cassettes 109 may store up to several dozen wafers 330 for automatic transport and alignment at wafer prober 100. In one embodiment, each cassette 109 may store twenty five wafers 330 to be tested. Main body 102 may also include a probe card 105 having electrical leads or probes 107 in a pattern that corresponds to electrical contact points or pads 333 on one or more devices 332 on wafer 330 to be tested. When testing is performed, pads 333 of one or more devices 332 under test are brought into contact with the corresponding probes 107 or leads of probe card 105, so that various test signals may be transmitted to and from devices 332 on wafer 330. In various embodiments, devices 332 may be wafer-level packaged imaging sensor devices (e.g., infrared imaging devices comprising a focal plane array (FPA), CMOS sensor devices, CCDs, or other imaging devices) fabricated on wafer 330.

Test head 104 (also referred to as a tester or tester head) of wafer prober 100 may be adapted to perform various testing operations. In various embodiments, test head 104 may be adapted to generate test patterns (e.g., test signals or data) and/or analyze output patterns (e.g., output signals or data) received from devices 332 to test and/or calibrate various operations of devices 332. In this regard, test head 104 may include test circuitry 111 adapted to generate test patterns, analyze output patterns, and/or perform other operations of test head 104. In one embodiment, test circuitry 111 may include a processor 112, a memory 114, interface circuitry 116, and/or other circuitry 118. A computer-readable medium 119 may store software instructions and/or data that may be executed and/or utilized by processor 112 of test circuitry 111 to control and/or coordinate testing of devices 332. In various embodiments, one or more portions of test circuitry 111 and/or computer-readable medium 119 may be positioned remotely from wafer prober 100.

In FIG. 1, test head 104 is shown in an open position. While test head 104 is in the open position, various service and/or maintenance operations, such as replacement of probe card 105, may be performed. Test head 104 may be lowered (e.g., using a pneumatic or motorized hinge 106) into a test position, which allows a pogo ring 108 and a header 110 to come into contact with each other at corresponding electrical contacts or pins. Pogo ring 108 and header 110 may be electrically connected to test circuitry 111 of test head 104 and probe card 105, respectively, and thus permit test circuitry 111 to be electrically connected to contact points or pads 333 of devices 332 via probe card 105 to transmit and receive test patterns while test head 104 is lowered into the test position.

Wafer prober 100 may be provided in configurations or constructions other than those shown in the illustrated embodiments. For example, wafer prober 100 may be implemented having one integrated body rather than a separate test head and a main body, a test head located within, below, or to a side of a main body, one or more cabinets, or other configurations. Such other wafer prober configurations are contemplated for other embodiments of the disclosure.

Figure 2:
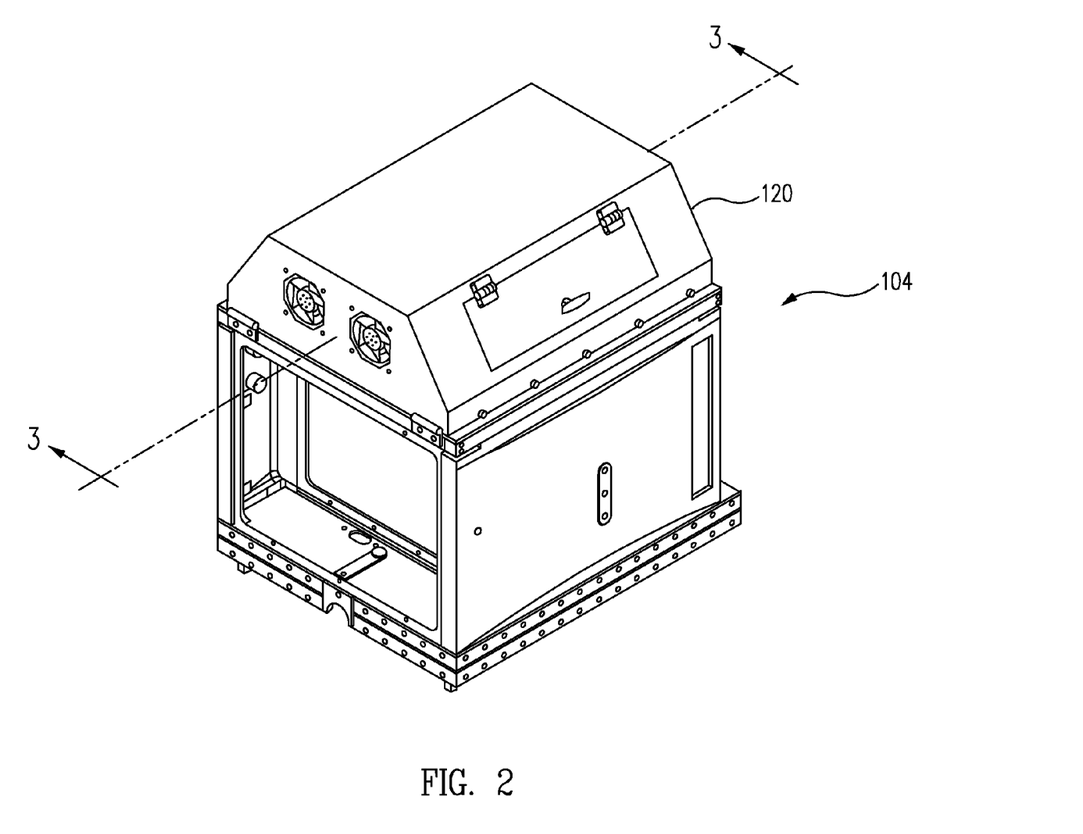
FIG. 2 illustrates a perspective view of a test head of the wafer prober of FIG. 1 in accordance with an embodiment of the disclosure.

FIG. 2 illustrates a perspective view of test head 104 of FIG. 1, in accordance with an embodiment of the disclosure. As shown in FIGS. 1 and 2, a large portion of an illuminator 120 may be disposed substantially on top of test head 104 in some embodiments. In other embodiments, illuminator 120 may be attached to, installed on, integrated into, or otherwise be implemented with wafer prober 100 in a manner other than shown in FIGS. 1 and 2. For example, a large portion of illuminator 120 may be integrated into and substantially enclosed within test head 104. In another example, at least a portion of illuminator may be disposed within main body 102. In other examples, various parts, components, or portions of illuminator 120 may be distributed and/or co-located at various parts and/or locations of wafer prober 100 as desired for particular applications of illuminator 120.

In various embodiments, illuminator 120 may be adapted to provide suitable illumination (e.g., visible and/or non-visible electromagnetic radiation) to the devices 332 as desired for performing high throughput testing of the devices 332. For example, illuminator 120 may be adapted to provide illumination with fast-switching intensity levels, wavelengths, and/or other properties. As such, illuminator 120 according to various embodiments may permit wafer prober 100 to perform high-throughput testing of responsivity and/or other operating parameters of devices 332 (e.g., imaging sensor devices) fabricated on wafer 330. In this regard, various components of illuminator 120 may be adapted to interface with test circuitry 111 of wafer prober 100 to allow illumination to be coordinated with testing. In various embodiments, test circuitry 111 may be adapted to generate and transmit appropriate control signals via interface circuitry 116 to various components of illuminator 120 to coordinate illumination as desired for various applications of wafer prober 100 and illuminator 120.

Figure 3:
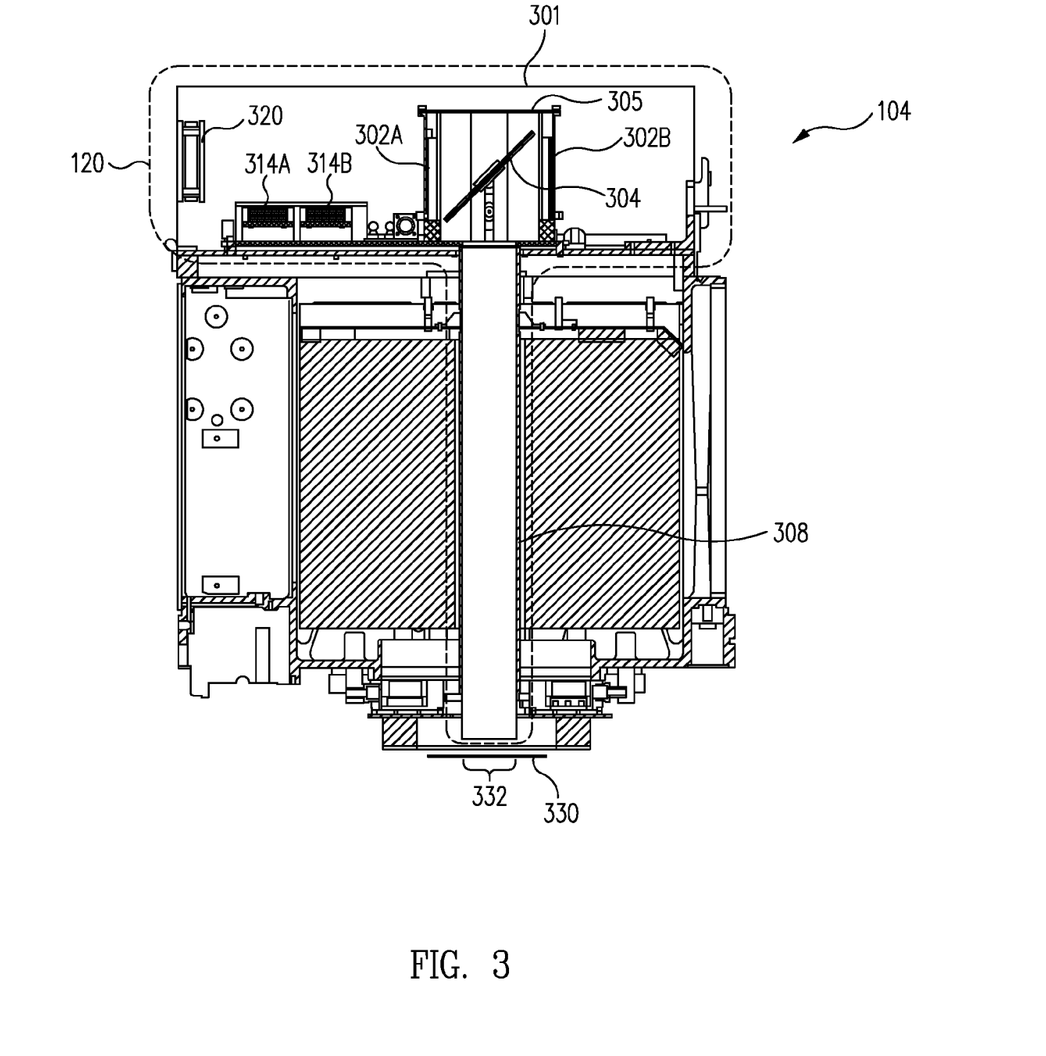
FIG. 3 illustrates a longitudinal cross section view along line 3-3 of the test head of FIG. 2 in accordance with an embodiment of the disclosure.
Figure 4:
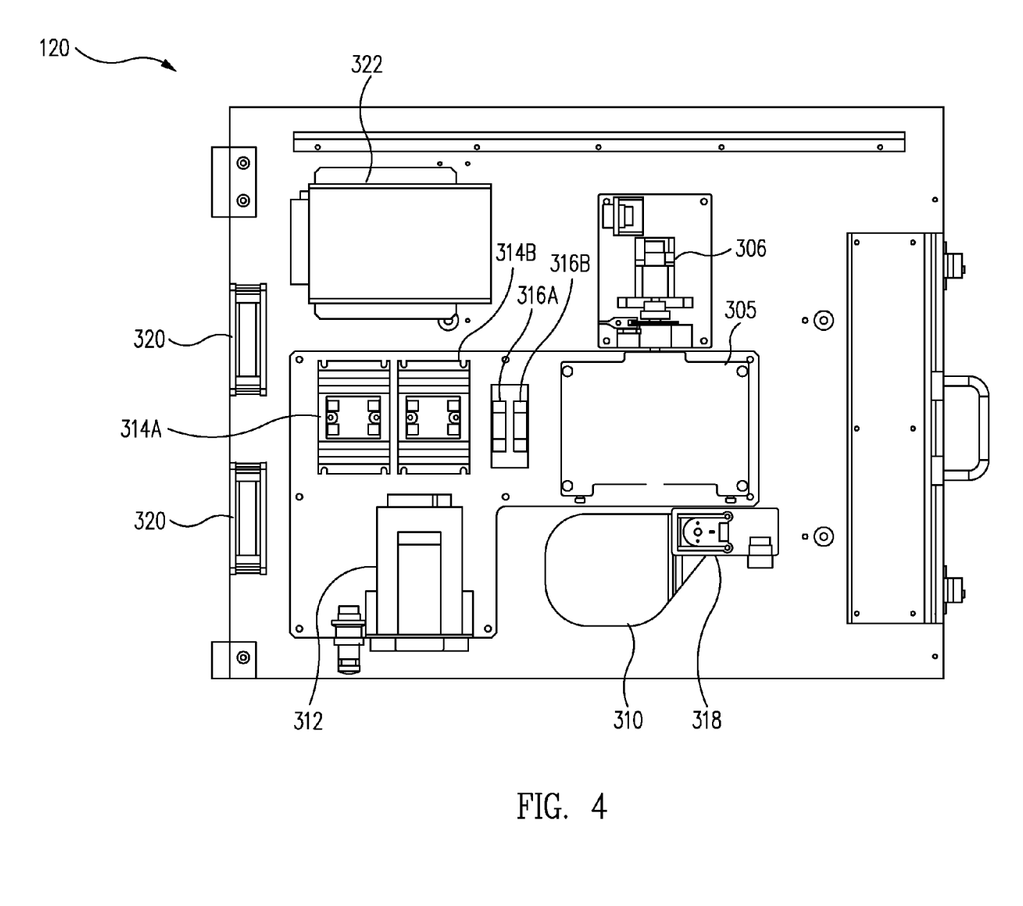
FIG. 4 illustrates an interior plan view of an illuminator in accordance with an embodiment of the disclosure.

FIG. 3 illustrates a longitudinal cross section view along line 3-3 of test head 104 of FIG. 2, in accordance with an embodiment of the disclosure. As shown, in some embodiments, various components of illuminator 120 may be substantially disposed on top of and/or integrated into test head 104. FIG. 4 illustrates a top plan view of illuminator 120 of FIG. 3 with a cover 301 removed, in accordance with an embodiment of the disclosure. With reference to FIGS. 3 and 4, illuminator 120 may include, in various embodiments, a plurality of radiation sources 302 (individually identified as 302A and 302B), a reflector 304, an actuator 306 for reflector 304, a light pipe 308, a shutter 310, a controller 312 for radiation sources 302, relays 314 (individually identified as 314A and 314B) for radiation sources 302, fuses 316 (individually identified as 316A and 316E) for radiation sources 302, an actuator 318 for shutter 310, cooling fans 320, and/or a power supply 322. In some embodiments, radiation sources 302 and/or reflector 304 may be disposed substantially within a reflector chamber 305 (e.g., in FIG. 4, radiation sources 302 and reflector 304 are hidden inside reflector chamber 305).

In various embodiments, radiation sources 302 may be adapted to emit radiation in wavelengths desired for illuminating devices 332 on wafer 330 to perform testing, calibration, inspection, and/or other processes. Such radiation may include, for example, visible light, long-wave infrared (LWIR) radiation, mid-wave infrared (MWIR) radiation, short-wave infrared (SWIR) radiation, ultraviolet (UV) radiation, X-ray radiation, or other electromagnetic radiation in other bands (e.g., other wavelengths). In some embodiments, radiation sources 302 may provide illumination to devices 332 implementing imaging devices or sensors, so that various operations of the imaging devices or sensors may be tested and/or calibrated by monitoring (e.g., using test circuitry 111) various outputs of the imaging devices or sensors in response to the illumination provided.

The operations of the imaging devices or sensors that may be tested include, in some embodiments, a responsivity of the imaging devices or sensors. That is, wafer prober 100 may be adapted to test changes in the imaging devices' or sensors' electrical output in response to changes in incident flux (e.g., intensity of incident light or radiation). In this regard, radiation sources 302 may each be adapted to emit radiation having a different level of intensity (e.g., generating a different amount of flux), so that a responsivity of the imaging devices or sensors may be tested by switching among radiation sources 302 to change incident flux to different levels with accuracy and repeatability.

In some embodiments, radiation sources 302 may be implemented using infrared (IR) radiation sources to emit IR radiation having desired intensity levels (e.g., flux) and/or wavelengths. For example, in one embodiment, radiation sources 302 may be implemented using light-emitting diodes (LEDs) or incandescent lamps adapted to emit IR radiation in desired intensity levels and/or wavelengths. In another embodiment, radiation sources 302 may be black bodies heated to appropriate temperatures to emit IR radiation having desired intensity levels and/or wavelengths.

Figure 5:
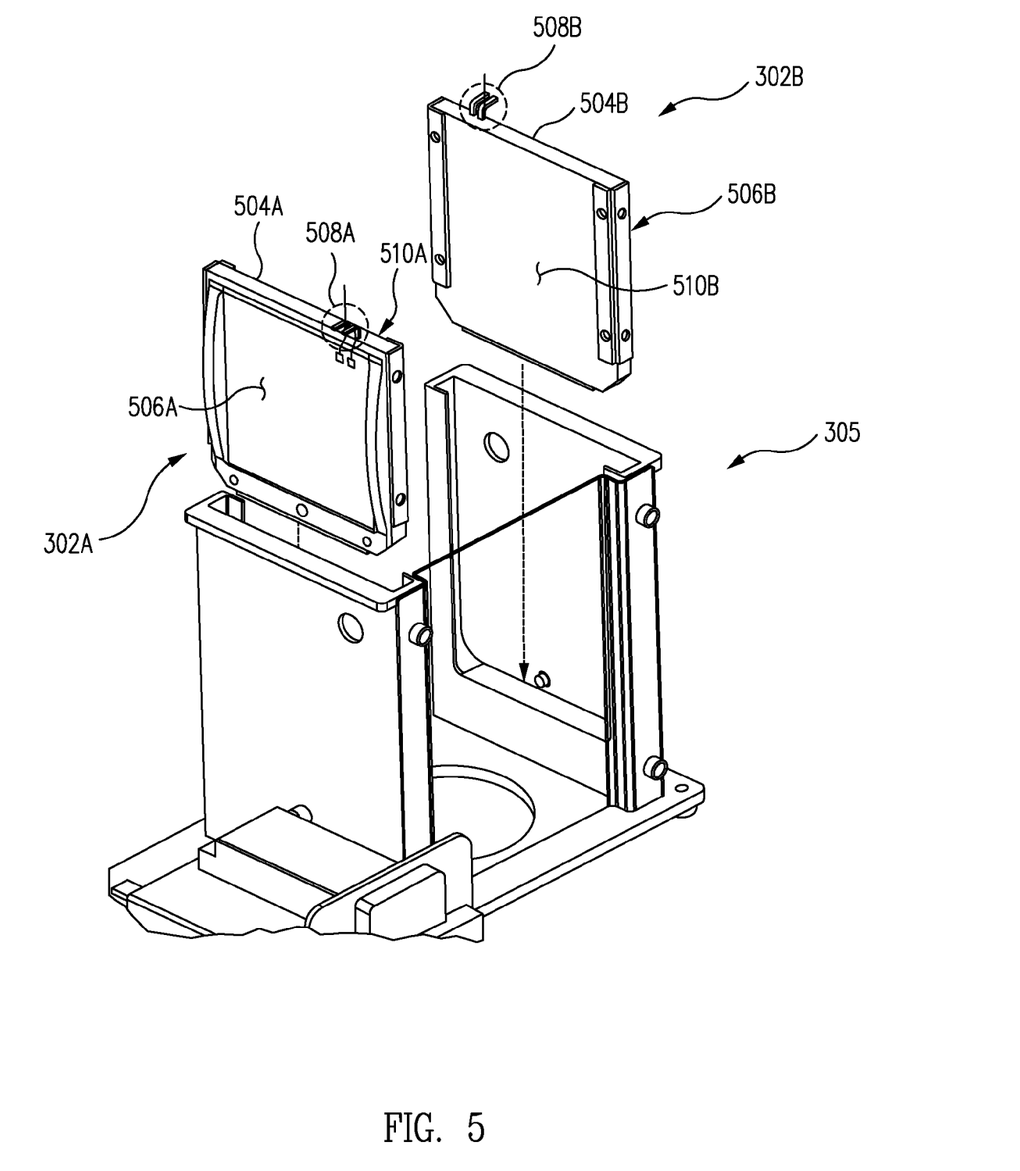
FIG. 5 illustrates an exploded view of a reflector chamber in accordance with an embodiment of the disclosure.

Referring to FIG. 5, an exploded view of reflector chamber 305 is illustrated with radiation sources 302A and 302B implemented using black bodies, in accordance with an embodiment of the disclosure. In one embodiment, radiation sources 302A and 302B may each include a metal block 504A/504B, a heater 506A/506B attached to a back side of metal block 504A/504B, and one or more thermocouples 508A/508B. Metal block 504A/504B may be implemented using copper, aluminum, or other metal with sufficient heat conductivity. A front side of metal block 504A/504B may include coatings 510A/510B suitable for achieving high and stable emissivity. By way of example, suitable material for coatings 510A/501B may include Akzo Nobel® 463-3-8 coating, which was determined in experiments carried out in connection with the disclosure to have a stabilized emissivity value of approximately 0.9 in LWIR wavelengths of 8 to 12 microns. Since metal block 504A/504B may include coatings 510A/510B with known emissivity, the intensity (e.g., flux) of IR radiation from radiation sources 302A/302B may be set to a desired level by heating metal block 504A/504B to an appropriate temperature (e.g., a temperature that would generate a desired LWIR in-band radiance as determined by numerically integrating the area under the Planck curve from 8 to 12 microns). Other suitable material for coatings 510A/510B may include Krylon® Ultra-Flat Black paint and other similar coating material or paint with high emissivity. In some embodiments, radiation sources 302A/302B may be approximations of black bodies (also referred to as grey bodies).

In one embodiment, heaters 506A/506B may be implemented using a flexible and/or thin film heating element, such as Kapton® (polyimide film) heaters from Omega Engineering, Inc. In one embodiment, heaters 506A/506B may be any such film heating element having a sufficient power rating for desired applications of illuminator 120 and attached to a back side of metal block 504A/504B. It is also contemplated that other types of heating elements having a sufficient power rating may be utilized to implement heaters 506A/506B for other embodiments. For example, heating pipes or heating wires may be mounted on, embedded in, or otherwise fixed to make contact with metal block 504A/504B.

In one embodiment, thermocouples 508A/508B may be embedded within, attached to, mounted on, or otherwise fixed to make contact with of metal block 504A/504B. In one embodiment, thermocouples 508A/508B may each comprise a pair of standard Type K thermocouples, one for temperature control feedback and another for a redundant temperature display/monitoring. In other embodiments, standard or proprietary thermocouples may be utilized as desired for various applications of illuminator 120. With reference also to FIGS. 3 and 4, in various embodiments, thermocouples 508A/508B provide output voltage indicative of the temperature of metal block 504A/504B to controller 312, which selectively turns on or off relays 314 that supply current to heater 506 in a feedback loop to heat up and maintain metal block 504A/504B to a desired temperature.

As shown in FIGS. 3 and 5, in one embodiment, radiation sources 302A and 302B may be disposed relative to reflector chamber 305 in a manner that allows the back side to be covered by a wall of reflector chamber 305. Such an arrangement may reduce heat loss. It should be noted, however, that while the illustrated embodiments of FIGS. 3 and 5 show two radiation sources 302A and 302B, other embodiments may comprise as many radiation sources as desired for particular applications of illuminator 120. For example, reflector chamber 305 may be a polygonal cylinder having more than four side surfaces, with radiation sources each disposed on three or more of the side surfaces.

Figure 6:
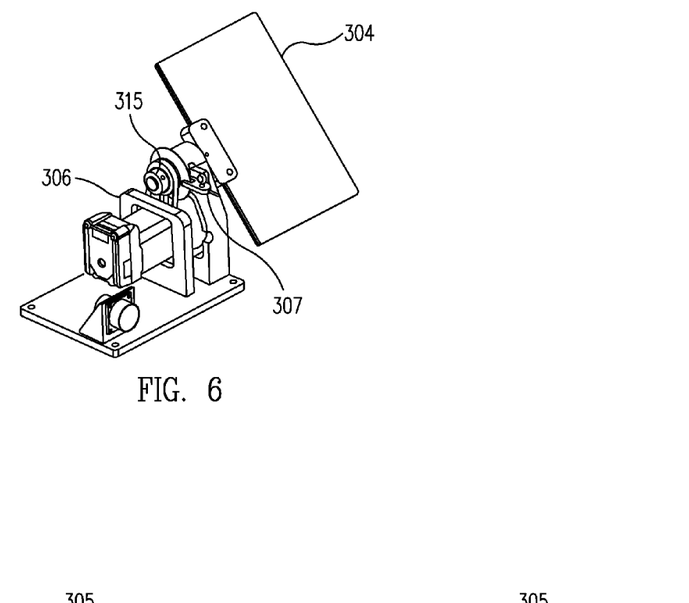
FIG. 6 illustrates a perspective view of a reflector and an actuator in accordance with an embodiment of the disclosure.

Referring to FIG. 6, a perspective view of reflector 304 and actuator 306 is illustrated according to one embodiment. In various embodiments, reflector 304 may be adapted to reflect radiation with high reflectivity in a desired waveband, such that radiation received at reflector 304 may be reflected to other directions without significant loss due to absorption. In one embodiment, reflector 304 may be of a substantially planar shape as shown in FIG. 6. In other embodiments, reflector 304 may take a form of a convex mirror, a concave mirror, a prism, or other suitable shape adapted to receive and direct radiation. In one embodiment, reflector 304 may be coated with, plated with, or made of material having high reflectivity in one or more IR wavebands. Such material may include gold, aluminum, silver, copper, or rhodium. Other material having high reflectivity in a desired waveband may be utilized for other applications of illuminator 120.

In various embodiments, actuator 306 may be connected to or otherwise coupled to reflector 304, and adapted to rotate, slide, shift, tilt, or otherwise move reflector 304 to a plurality of different positions (e.g., different orientations and/or locations) to allow reflector 304 to direct radiation emitted from a different selected ones of radiation sources 302 onto devices 332 on wafer 330. For example, in one embodiment, actuator 306 may be adapted to rotate reflector 304 to alternate between a first position to direct radiation from radiation source 302A onto devices 332, and a second position to direct radiation from radiation source 302B.

Figure 7A:
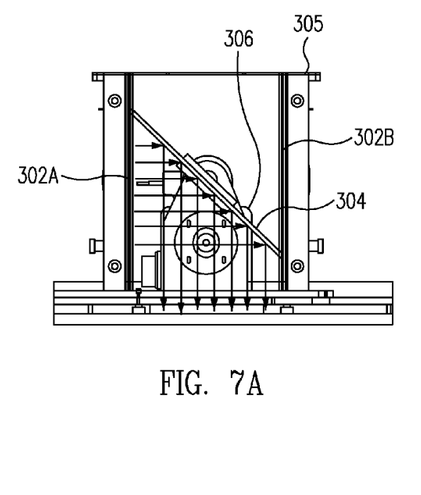
FIGS. 7A-7B illustrate side views of a reflector chamber with the reflector of FIG. 6 in several positions, in accordance with various embodiments of the disclosure.
Figure 7B:
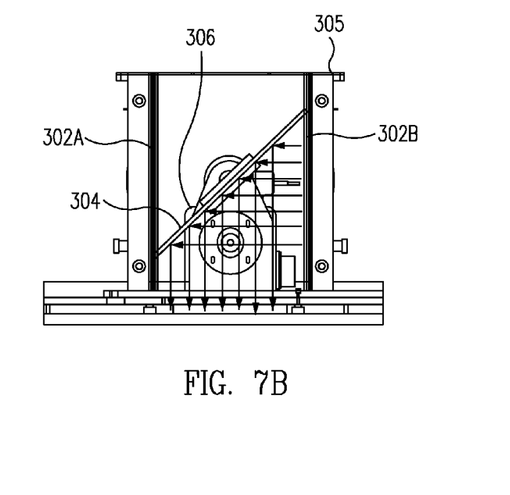

FIGS. 7A-7B illustrate a side view of reflector chamber 305 with reflector 304 rotated by actuator 306 to the first and second positions, respectively, with parallel arrows showing general directions of radiation from radiation sources 302A and 302B being received and directed by reflector 304, in accordance with such an embodiment. This and other embodiments of illuminator 120 may thus permit fast switching among a plurality of radiation sources, each of which may be adapted to emit radiation having an intensity level and/or wavelength different from each other. As such, various embodiments of illuminator 120 may allow wafer prober 100 to perform high-throughput testing of devices 332, by rapidly producing radiation with different levels of intensity without having to wait for a single radiation source to transition to and stabilize at different intensities and/or wavelengths. By way of example, in one application of illuminator 120, it may take less than approximately 0.1 seconds for actuator 306 to move reflector 304 to different positions, whereas it may take more than 10 seconds to wait for an IR radiation source (e.g., a black body) to transition and stabilize to different temperatures for generating different levels of IR flux.

Referring again to FIG. 6, in some embodiments, actuator 306 may be coupled to reflector 304 through a pulley 315 or other suitable coupling mechanism. In other embodiments, actuator 306 may be connected to reflector 304 without pulley 315 or other coupling mechanism. Actuator 306 may be implemented with an electric motor, a pneumatic drive, a hydraulic drive, or other suitable drive mechanism. In one embodiment, actuator 306 may be implemented with a stepper motor comprising an integrated controller and position encoder, and may be programmed to switch among a plurality of preset positions in response to trigger signals. In some embodiments, a separate position sensor 307 may provide additional angle information for more accurate control and/or monitoring of the position of actuator 306 and reflector 304. In some embodiments, reflector 304 and/or actuator 306 may comprise a mechanical stop and/or a limit switch for additional control over reflector 304 and actuator 306 positioning.

Figure 8A:
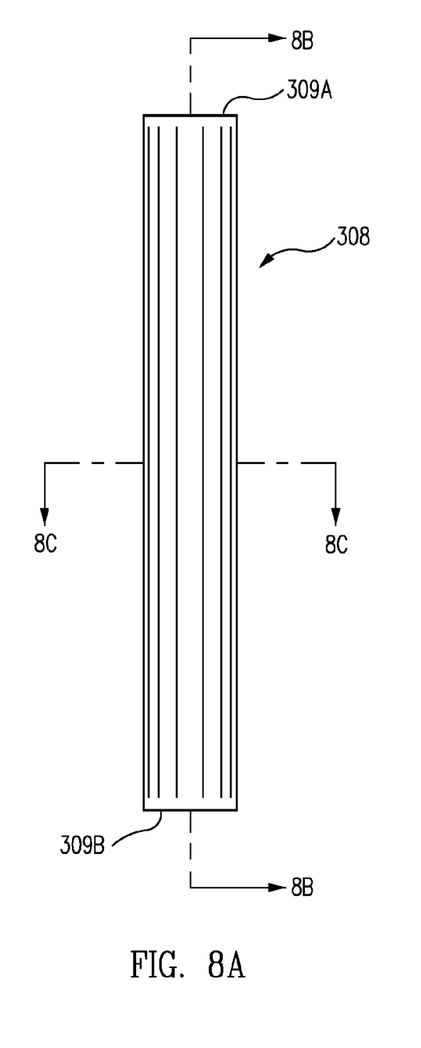
FIGS. 8A-8C illustrate several views of a light pipe in accordance with various embodiments of the disclosure.
Figure 8B:
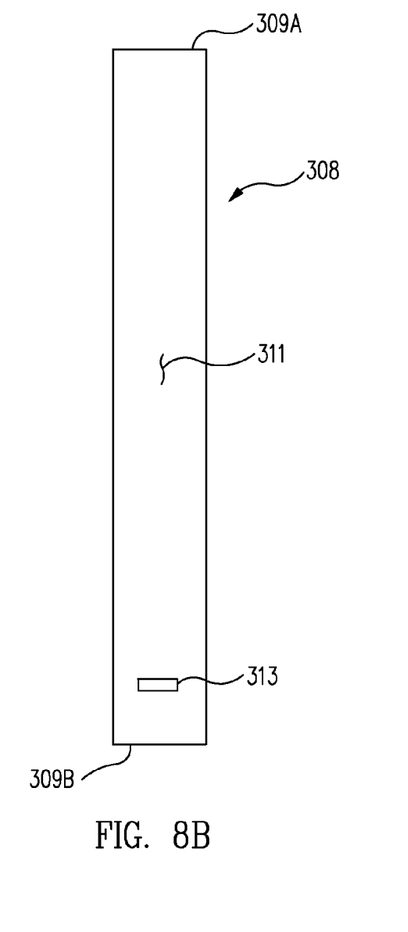
Figure 8C:
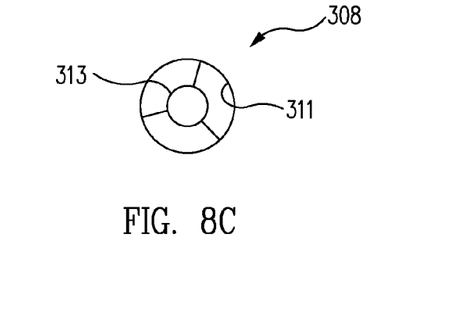

FIGS. 8A-8C illustrate various views of light pipe 308 of FIG. 3, in accordance with an embodiment of the disclosure. More specifically, FIG. 8A is a side view of light pipe 308, FIG. 8B is a longitudinal section view of light pipe 308 along line 8B-8B, and FIG. 8C is a cross section view of light pipe 308 along line 8C-8C, in accordance with an embodiment of the disclosure.

In various embodiments, light pipe 308 may be disposed substantially between reflector 304 and devices 332, and may be adapted to pass radiation received at its first end 309A to its second end 309B. In some embodiments, light pipe 308 may be substantially shaped as a hollow tube with both of its ends open and having a reflective interior surface 311 adapted to pass radiation from first end 309A to second end 309B. In such embodiments, multiple reflections generated by reflective interior surface 311 may allow light pipe 308 to operate as an effective optical concentrator and diffuser. As such, light pipe 308 according to various embodiments may provide sufficiently uniform illumination over devices 332 through second end 309B while radiation from a selected one of radiation sources 302 is directed toward first end 309A by reflector 304. In addition, light pipe 308 according to various embodiments may pass radiation with sufficient transmission efficiency, such that the output of radiation sources 302 need not be substantially increased (e.g., by increasing the temperature of black bodies) to compensate for transmission loss. Thus, light pipe 308 in various embodiments may provide transmission of radiation from reflector 304 to devices 332 with sufficient uniformity and efficiency, without a need for expensive lenses or other optical elements to implement conventional relay optics.

By way of example, experiments carried out in connection with the disclosure show that light pipe 308, implemented according to one embodiment of the disclosure and having a dimension of approximately 700 mm by 80 mm (in length and diameter, respectively), produces sufficiently uniform illumination across a central 20 mm section at second end 309B, with transmission efficiency equivalent to F/1 optics. For many applications of wafer prober 100, such illumination may be sufficient for testing more than one devices 332 at a time with accuracy and repeatability. The dimensions above are given only for purposes of example, and a light pipe of any other length and/or diameter suitable for use with wafer prober 100 (e.g., sized to fit in a channel or other space available in wafer prober 100) may be utilized to implement light pipe 308.

In various embodiments, reflective interior surface 311 may be coated with, plated with, or made of material having high reflectivity in a desired waveband. Such material may include gold, aluminum, silver, copper, or rhodium. Other material having high reflectivity in a desired waveband may be utilized for other applications of illuminator 120. In one embodiment, light pipe 308 may be made of polished aluminum and comprise reflective interior surface 311 coated or plated with gold. The gold plating or coating in reflective interior surface 311 of such an embodiment may permit reflectivity of 96% or greater for IR radiation in a 7 to 14 micron band, even at low incidence angles. In addition, the gold plating or coating may prevent surface oxidation and subsequent reduction in transmission efficiency.

In some embodiments, light pipe 308 may include an apodizer 313 adapted to further improve uniformity or otherwise change the illumination profile of radiation transmitted to devices 332. In one embodiment, apodizer 313 may cover some portion of the interior passage of light pipe 308 as shown in FIGS. 8B-8C, so as to block at least some direct radiation from reaching devices 332 and thus flatten the illumination over devices 332. In such an embodiment, apodizer 313 may be a small stop or disk having low transmissivity (e.g., that substantially blocks transmission) in a desired waveband, and may be suspended by thin wires or otherwise placed within the interior passage of light pipe 308. Other apodizer implementations, such as apodizing filters or apodizing lenses, are also contemplated.

Figure 9A:
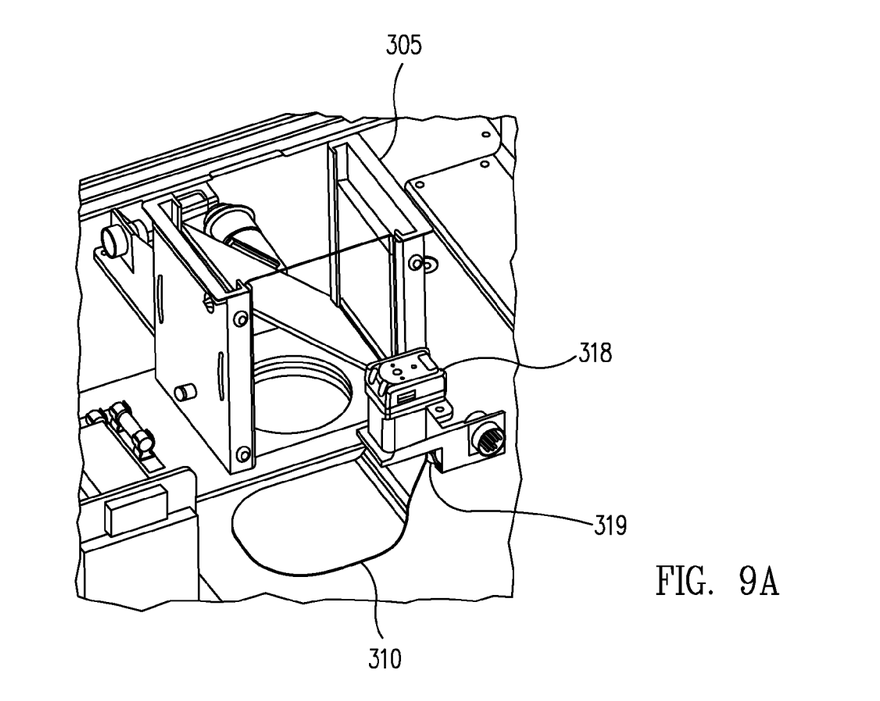
FIGS. 9A-9B illustrate perspective views of a shutter in accordance with various embodiments of the disclosure.
Figure 9B:
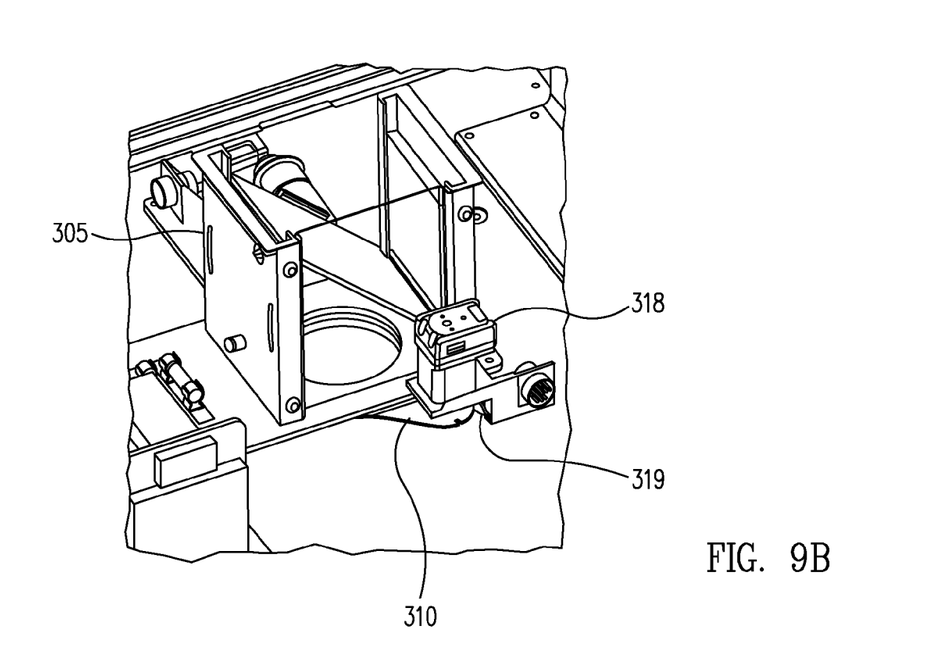

FIGS. 9A and 9B show various views of shutter 310 of FIG. 4, in accordance with embodiments of the disclosure. More specifically, FIG. 9A illustrates a perspective view of reflector chamber 305 with shutter 310 in an open position, and FIG. 9B illustrates a perspective view of reflector chamber 305 with shutter 310 in a closed position. In various embodiments, shutter 310 may be adapted to substantially block radiation emitted by radiation sources 302 from reaching devices 332 while shutter 310 is in a closed position.

In one embodiment, shutter 310 may be implemented using a metal plate at least as large as the opening at first end 309A of light pipe 308 and disposed between reflector 304 and first end 309A of light pipe 308, as shown in FIGS. 9A-9B. Shutter 310 of such an embodiment may sufficiently close off first end 309A of light pipe 308 when in a closed position, such that a substantial portion of radiation directed by reflector 304 may be blocked from entering light pipe 308. In other embodiments, shutter 310 may be disposed at other locations suitable for selectively blocking radiation emitted by radiation sources 302 from reaching devices 332, and may be of size and shape suitable for such other locations. For example, shutter 310 may be disposed between devices 332 and second end 309B of light pipe 308, and may be of size and shape suitable for sufficiently covering the opening at second end 309B. In another example, shutter 310 may be disposed near or on each one of radiation sources 302, and adapted to block radiation emitted by radiation sources 302 from reaching reflector 304.

Various embodiments of shutter 310 may thus permit testing, calibration, and/or inspection of devices 332 under ambient light or ambient IR flux conditions, by substantially blocking off radiation emitted by radiation sources 302. In this regard, cooling fans 320 of FIGS. 3 and 4 may be utilized in some embodiments to help keep shutter 310 near an ambient temperature and thus may reduce additional IR flux that may be generated by shutter 310 itself. Further in this regard, in some embodiments, shutter 310 may be coated with, plated with, or made of material having high reflectivity and correspondingly low emissivity in a desired IR band, such that shutter 310 may emit little IR radiation of its own. Such material may include gold, aluminum, silver, copper, rhodium, or other suitable material. Ambient light or ambient IR flux conditions may be utilized, for example, by wafer prober 100 to collect noise data associated with devices 332 implementing image sensors. In some embodiments, wafer prober 100 may be adapted to calibrate devices 332 based on the collected noise data.

In various embodiments, shutter 310 may be connected to or otherwise coupled to actuator 318 adapted to rotate, slide, shift, tilt, or otherwise move shutter 310 to alternate between an open and a closed position. Actuator 318 may be implemented with an electric motor, a pneumatic drive, a hydraulic drive, or other suitable drive mechanism. In one embodiment, actuator 318 may be implemented with a stepper motor comprising an integrated controller and position encoder, and may be programmed to rotate shutter 310 between two preset positions in response to trigger signals. In some embodiments, a separate position sensor 319 may provide additional angle information for more accurate control and/or monitoring of the position of shutter 310 and actuator 318.

Figure 10:
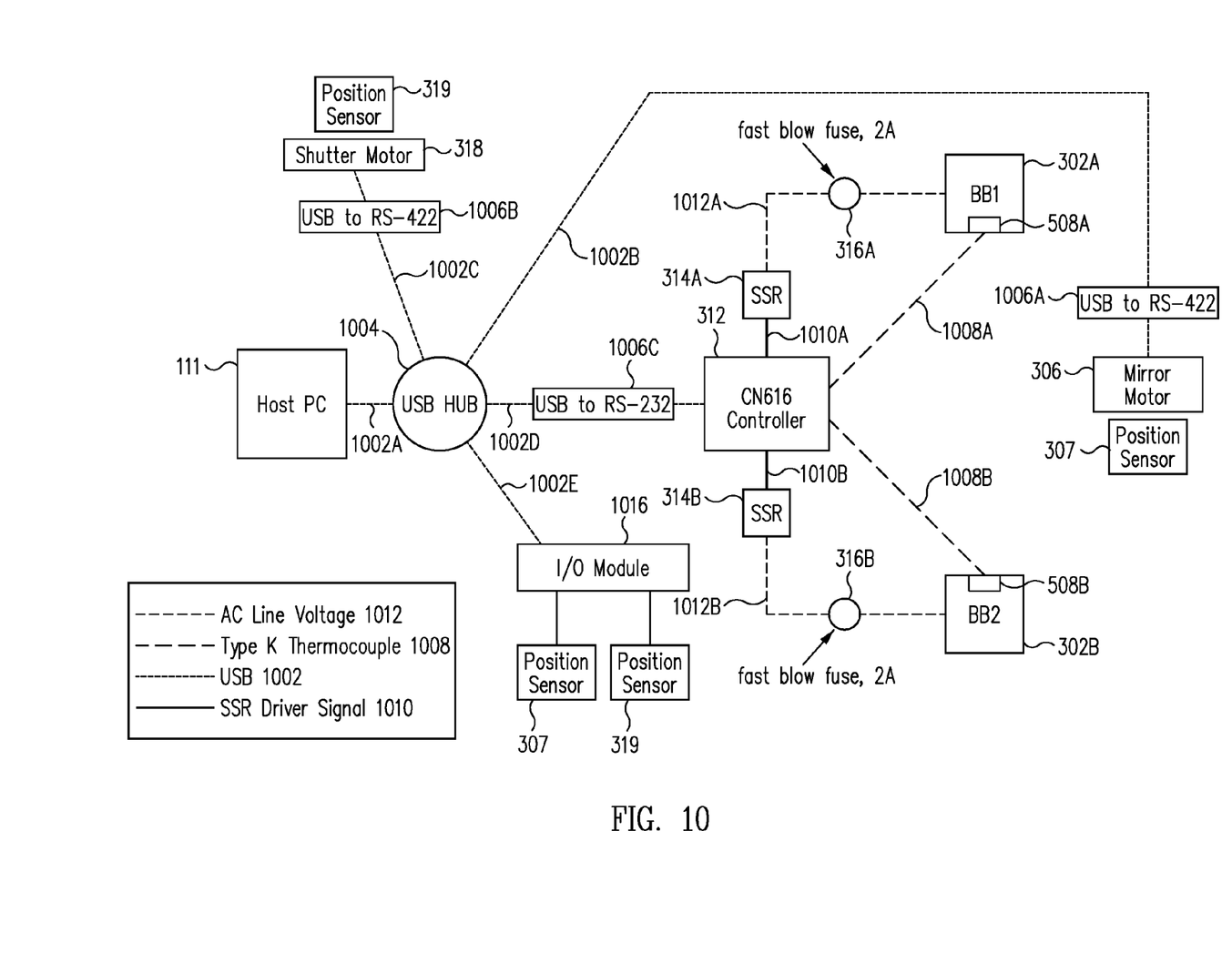
FIG. 10 illustrates an electrical block diagram of the wafer prober and the illuminator of FIG. 1, in accordance with an embodiment of the disclosure.

FIG. 10 is an electrical block diagram illustrating connections between various components of wafer prober 100 and illuminator 120, in accordance with an embodiment of the disclosure. In various embodiments, test circuitry 111 (e.g., identified in FIG. 10 as a host PC) of wafer prober 100 may be adapted to generate control signals to coordinate various operations of illuminator 120 described herein with various testing operations that may be performed by wafer prober 100. For example, in one embodiment, such control signals may be generated by processor 112 executing software instructions stored in memory 114, and/or further processed by interface circuitry 116 for transmission to various components of illuminator 120.

In various embodiments, such control signals may be transmitted to actuator 306 for reflector 304, actuator 318 for shutter 310, and/or controller 312 for radiation sources 302 via communication links 1002A-1002E. In some embodiments, a hub device 1004 may be utilized to expand the number of communication links 1002A-1002E and/or manage multiple communication links 1002A-1002E. In some embodiments, converter devices 1006A-1006C may be utilized to convert control signals from test circuitry 111 into formats, standards, or protocols utilized by various components of illuminator 120 (e.g., between Universal Serial Bus (USB) and RS-232 or RS-422, in some embodiments). The use of hub device 1004 and/or converter devices 1006A-1006C may permit test circuitry 111 to utilize a unified format, standard, or protocol for control signals, and thus may reduce complexity. In one embodiment, test circuitry 111 may encode control signals in a standard USB protocol. Accordingly, in one embodiment, communication links 1002A-1002E may include USB links, hub device 1004 may be a USB hub device, and converter devices 1006A-1006C may be adapted to convert USB signals into appropriate formats utilized by various components of illuminator 120.

In various embodiments, controller 312 may be adapted to manage radiation output of radiation sources 302A-302B, in response to control signals received from test circuitry 111. For embodiments in which black bodies are utilized to implement radiation sources 302A-302B, a temperature controller may be utilized to implement controller 312. One such temperature controller may be CN616 temperature controller from Omega Engineering, Inc. For embodiments in which black bodies are utilized to implement radiation sources 302A-302B, controller 312 may receive temperature readings from thermocouples 508A/508B of black bodies via temperature output links 1008A-1008B for feedback control of black body temperatures.

In some embodiments, controller 312 may indirectly control radiation sources 302A-302B by driving (e.g., providing appropriate voltage, transmitting appropriate control signals, or otherwise controlling) relays 314A-314B via relay driver links 1010A-1010B. In such embodiments, relays 314A-314B may supply appropriate power via electrical wires 1012A-1012B to radiation sources 302A-302B in response to driving signals received from controller 312. In one embodiment, relays 314A-314B may be implemented using solid state relays (SSRs). Fuses 316A/316B may be utilized as desired for some embodiments to protect relays 314A-314B, radiation sources 302A-302B, and/or other components of illuminator 120. In some embodiments, an I/O module 1016 may be utilized to provide communication between test circuitry 111 and some components of illuminator 120. For example, actuator position readings from position sensors 307 and 319 may be transmitted to circuitry 111 via I/O module 1016.

Other implementations of the electrical block diagram illustrated in FIG. 10 are also contemplated. For example, for embodiments in which radiation sources 302 may be lamps, LEDs, or other types of radiation sources, a temperature controller may be used to implement controller 312 with appropriate light control circuitry. In another example, various USB links, devices, hubs, and/or converters may be substituted with appropriate components implementing other standard or proprietary communication protocols or formats as desired.

Figure 11:
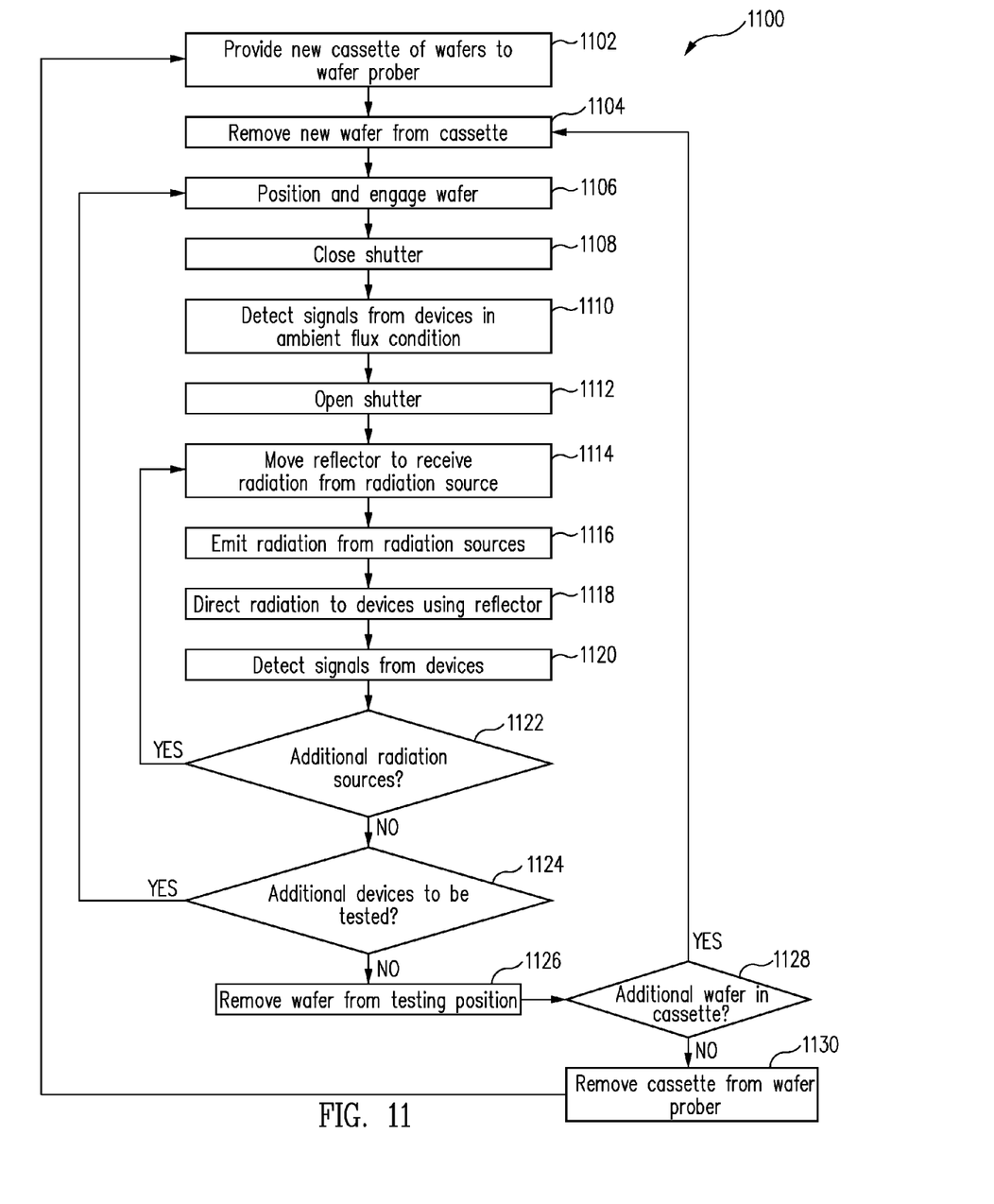
FIG. 11 illustrates a flowchart of a process to illuminate devices on a wafer to be tested by a wafer prober in accordance with an embodiment of the disclosure.

Turning now to FIG. 11, a flowchart of a process 1100 to illuminate devices on a wafer to be tested by a wafer prober is illustrated, in accordance with an embodiment of the disclosure. For example, all or part of process 1100 may be performed by various embodiments of wafer prober 100 and illuminator 120 or other suitable devices to illuminate devices 332 on wafers 330 for testing, calibration, inspection, and other wafer-level processes.

At block 1102, a new cassette 109 of wafers 330 may be provided to wafer prober 100. For example, one or more cassettes 109 containing multiple wafers 330 to be tested, calibrated, inspected, or otherwise processed at wafer prober 100 may be automatically or manually placed or loaded at an appropriate location of wafer prober 100.

At block 1104, a new wafer 330 may be removed from cassette 109 and transported to a position for testing, calibration, inspection, and/or otherwise processing one or more devices 332 on wafer 332. For example, wafer 330 may be removed from cassette 109, and transported to where devices 332 on wafer 330 may be engaged by probe card 105 for testing.

At block 1106, wafer 330 may be positioned and engaged for testing, calibration, inspection, or other processing. For example, wafer 330 and/or probe card 105 may be shifted, aligned, and/or otherwise positioned by wafer prober 100, so that probes 107 of probe card 105 may make contact or otherwise engage with corresponding pads 333 of devices 332 to be tested. In some embodiments, up to eight devices 332 on wafer 330 may be tested in one engagement of probe card 105.

At blocks 1108-1112, the engaged devices 332 may be tested, calibrated, inspected, and/or otherwise processed in an ambient light or flux condition by closing shutter 310 (e.g., to determine background radiation and/or noise). In some embodiments, all or part of blocks 1108-1112 may be omitted or performed after or between testing devices 332 with radiation from radiation sources 302 (e.g., blocks 1014-1020).

More specifically, at block 1108, shutter 310 may be closed to substantially block radiation other than ambient radiation (e.g., ambient light or flux) from reaching devices 332 on wafer 330. For example, shutter 310 may be moved to a closed position using actuator 318 to substantially block the radiation that may be emitted by radiation sources 302 from reaching devices 332, so that an ambient light or flux condition may be provided to devices 332.

At block 1110, test circuitry 111 of wafer prober 100 may detect signals generated by devices 332 in the ambient light or flux condition created by closing shutter 310. For example, in embodiments where devices 332 are imaging sensor devices, wafer prober 100 may read, receive, or detect, using test circuitry 111, the output generated by devices 332 in the ambient light or flux condition. Wafer prober 100 may then analyze the detected signals to test and/or calibrate various operations of devices 332. In some embodiments, wafer prober 100 may detect the signals to collect background radiation and/or noise data associated with devices 332. In some embodiments, devices 332 may be calibrated by wafer prober 100 based on the collected data.

At block 1112, shutter 310 may be opened. For example, shutter 310 may be moved to an open position using actuator 318, so that radiation from one or more radiation sources 302 may be able to reach devices 332.

At block 1114, reflector 304 may be moved to one of a plurality of positions to receive radiation from one or more radiation sources 302. For example, reflector 304 may be moved by actuator 306 to a position to receive radiation from one of radiation sources 302. In some embodiments, reflector 304 may be rotated (e.g., by actuator 306) to one of a plurality of orientations to receive radiation from one of radiation sources 302. In one embodiment, reflector 304 may be rotated to a selected one of two orientations to receive radiation from a selected one of radiation sources 302A or 302B.

At block 1116, radiation (e.g., including IR radiation, visible light, or electromagnetic waves in other wavebands) may be emitted by one or more radiation sources 302. For example, radiation of varying intensities and/or wavelengths may be emitted using a plurality of radiation sources 302 described above. In some embodiments, IR radiation having levels of intensity (e.g., flux) different from one another may be emitted using a plurality of IR radiation sources (e.g., radiation sources 302). In one embodiment, IR radiation having different intensities emitted by heating a plurality of black bodies (e.g., black bodies implementing radiation sources 302) each to a different temperature. In various embodiments, one or more radiation sources 302 may be selectively turned on or off at block 1116 and/or at other times (e.g., before, during, and/or after various operations of process 1100). In other embodiments, one or more radiation sources 302 may remain on continuously.

At block 1118, the radiation received at the reflector from a selected radiation source 302 may be directed to one or more devices 332 on wafer 330. For example, reflector 304 of illuminator 120 may direct, using its reflective surface, the radiation emitted by the selected radiation source 302 to one or more devices 332 on wafer 330 engaged by probe card 105. In some embodiments, the radiation received at reflector 304 may be directed to light pipe 308 and transmitted to devices 332 by light pipe 308. In some embodiments, an illumination profile of the radiation transmitted to devices 332 may be adjusted (e.g., flattened, softened, or otherwise modified), for example, by apodizer 313 of light pipe 308 during block 1118. In some embodiments, the radiation may be directed and transmitted to wafer 330 to provide substantially uniform illumination to any desired number of devices 332 on wafer 330 (e.g., up to eight devices in one embodiment).

At block 1120, wafer prober 100 may detect signals generated by devices 332 in response to the radiation passed to devices 332. For example, test circuitry 111 of wafer prober 100 may detect, via probe card 105, output signals generated by devices 332 in response to the radiation directed and transmitted to them. Wafer prober 100 may then analyze the detected signals to test and/or calibrate various operations of devices 332. In some embodiments, the detected signals may be analyzed to test the responsivity of devices 332 to the radiation directed to them. In some embodiments, wafer prober 100 may detect output signals generated in response to radiation in one or more IR wavebands.

At block 1122, if it is desired to test devices 332 using another radiation source 302, process 1100 may return to block 1114. That is, reflector 304 may be moved to a different position to receive and direct radiation from different radiation source 302, and the signals detected by wafer prober 100 may be generated in response thereto. For example, in one embodiment, reflector 304 may switch between directing radiation received from radiation sources 302A and 304B. If no additional radiation sources 302 remain to be used, process 1100 continues to block 1124.

At block 1124, probe card 105 may be disengaged from device 332 currently under test. Also at block 1124, it may be determined whether there are any additional devices 332 on other portions of wafer 330 that remain to be tested. For example, test circuitry 111 of wafer prober 100 may determine whether there are any remaining devices 332 to be tested on wafer 330, and if so where such devices 332 may be located on wafer 333, based on information regarding wafer 330 provided to test circuitry 111.

If there are devices 332 that remain to be tested, process 1100 may return to block 1106 where wafer 330 may be repositioned and probe card 105 is engaged with the additional devices 332 to be tested. In some embodiments, up to one thousand devices 332 may be fabricated and/or packaged on the wafer, and blocks 1106-1124 may be repeated until all or a desired number of devices 332 on wafer 330 are tested.

If there are no more devices 332 on wafer 330 that remain to be tested, calibrated, inspected, and/or otherwise processed, wafer 332 may be unloaded, transported away, or otherwise removed from the testing position, at block 1126. For example, wafer prober 100 may unload and transport wafer 330 back to cassette 109, where wafer 330 may remain until another stage of manufacturing (e.g., singulating individual devices from wafer 330) may be performed. In some embodiments, wafer 330 may be replaced in the same cassette 109 from which it came. In other embodiments, wafer 330 may be moved to a new cassette 109 different from the one it came from.

At block 1128, it may be determined whether there are additional wafers 330 in cassette 109 that remain to be tested. For example, test circuitry 111 of wafer prober 100 may determine whether any wafers 330 remain to be tested, based on information regarding cassette 109 provided to test circuitry 111.

If there are additional wafers 330 to be tested, process 1100 may return to block 1104 where the next wafer 330 is removed from cassette 109 for testing. In some embodiments, up to twenty-five wafers 330 may be contained in each cassette 109, and blocks 1104-1128 may be repeated until all or a desired number of wafers 330 of cassette 109 are tested.

If there are no wafers 330 to be tested remaining in cassette 109, at block 1130, cassette 109 may be unloaded or otherwise removed from wafer prober 100, and process 1100 may return to block 1102 for testing wafers 330 of a new cassette 109 if desired.

In various embodiments, any operation of process 1100 may be reordered, combined, modified, and/or omitted as desired for particular applications of process 1100. For example, various operations of process 1100 may be modified without departing from the scope of the disclosure, to coordinate illumination operations with various wafer-level testing, calibration, and/or inspection operations on various types of imaging sensor devices and other devices that may be tested using a wafer prober.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into substeps to provide features described herein.

Embodiments described above illustrate but do not limit the invention. It should also be understood that numerous modifications and variations are possible in accordance with the principles of the invention. Accordingly, the scope of the invention is defined only by the following claims.

What is claimed is:

1. An apparatus comprising:
   a plurality of infrared (IR) radiation sources;
   a reflector comprising a first reflective surface and a second reflective surface disposed on opposite sides of the reflector and adapted to receive IR radiation from the IR radiation sources;
   an actuator adapted to selectively move the reflector to a plurality of different positions to use the first and second reflective surfaces, respectively, to direct the IR radiation emitted from different selected ones of the IR radiation sources to devices on a wafer; and
   wherein the apparatus is adapted to be implemented with a wafer prober to test the devices.

2. The apparatus of claim 1, further comprising a light pipe comprising a reflective interior surface adapted to pass the IR radiation from the selected one of the IR radiation sources to the devices.

3. The apparatus of claim 2, wherein the light pipe comprises an apodizer adapted to adjust an illumination profile of the IR radiation passed to the devices.

4. The apparatus of claim 3, wherein the apodizer is suspended in an interior passage of the light pipe.

5. The apparatus of claim 2, wherein the reflective interior surface comprises gold, aluminum, silver, copper, or rhodium.

6. The apparatus of claim 1, further comprising a shutter adapted to selectively block or pass the IR radiation from the selected one of the IR radiation sources to the devices.

7. The apparatus of claim 1, wherein each of the IR radiation sources is adapted to emit its associated IR radiation with a different intensity and/or wavelength than the other IR radiation sources.

8. The apparatus of claim 1, wherein each of the IR radiation sources is a black body adapted to be heated to a different temperature to emit its associated IR radiation with a different intensity than the other IR radiation sources.

9. The apparatus of claim 1, wherein the reflector comprises at least one of gold, aluminum, silver, copper, or rhodium reflective surface.

10. The apparatus of claim 1, wherein:
    the actuator is adapted to move the reflector by rotating the reflector to a first one of the positions to direct the IR radiation from a first one of the IR radiation sources via the first reflective surface to the devices, and move the reflector by rotating the reflector to a second one of the positions to direct the IR radiation from a second one of the IR radiation sources via the second reflective surface to the devices; and
    the first and second IR radiation sources are disposed substantially opposite each other.

11. The apparatus of claim 1, further comprising the wafer prober, wherein the devices are imaging sensors comprising bolometers responsive to the IR radiation directed by the reflector, and wherein the wafer prober comprises test circuitry adapted to detect signals from the imaging sensors in response to the IR radiation received by the bolometers.

12. A method comprising:
    emitting infrared (IR) radiation from a plurality of IR radiation sources;
    receiving the IR radiation from at least one of the IR radiation sources at a reflector;

rotating the reflector to a first one of a plurality of different positions to direct the IR radiation emitted from a first one of the plurality of IR radiation sources to devices on a wafer;

rotating the reflector to a second one of the plurality of different positions to direct the IR radiation emitted from a second one of the plurality of IR radiation sources to the devices on the wafer; and detecting, by a wafer prober, signals from the devices in response to the IR radiation from the different IR radiation sources directed to the devices, wherein the devices comprise imaging sensors comprising bolometers responsive to the IR radiation directed by the reflector.

13. The method of claim 12, further comprising passing, by a reflective interior surface of a light pipe, the IR radiation from the reflector to the devices.

14. The method of claim 13, further comprising adjusting, by an apodizer of the light pipe, an illumination profile of the IR radiation passed to the devices.

15. The method of claim 13, wherein the reflective interior surface comprises gold, aluminum, silver, copper, or rhodium.

16. The method of claim 12, further comprising selectively blocking or passing, by a shutter, the IR radiation from the reflector to the devices.

17. The method of claim 12, wherein each of the IR radiation sources emits its associated IR radiation with a different intensity and/or wavelength than the other IR radiation sources.

18. The method of claim 12, wherein each of the IR radiation sources is a black body heated to a different temperature to emit its associated IR radiation with a different intensity than the other IR radiation sources.

19. The method of claim 12, wherein the reflector comprises at least one of gold, aluminum, silver, copper, or rhodium reflective surface.

20. The method of claim 12, wherein:
the reflector comprises a first reflective surface and a second reflective surface disposed on opposite sides of the reflector; and
the first and second IR radiation sources are disposed substantially opposite each other.

* * * * *